United States Patent
Singer et al.

[11] Patent Number: 5,854,574
[45] Date of Patent: *Dec. 29, 1998

[54] REFERENCE BUFFER WITH MULTIPLE GAIN STAGES FOR LARGE, CONTROLLED EFFECTIVE TRANSCONDUCTANCE

[75] Inventors: Lawrence Singer, Bedford; Todd L. Brooks, Boston, both of Mass.

[73] Assignee: Analog Devices, Inc., Norwood, Mass.

[21] Appl. No.: 639,208

[22] Filed: Apr. 26, 1996

[*] Notice: This patent issued on a continued prosecution application filed under 37 CFR 1.53(d), and is subject to the twenty year patent term provisions of 35 U.S.C. 154(a)(2).

[51] Int. Cl.⁶ ............................. H03F 1/34; H03F 1/42
[52] U.S. Cl. .................. 330/293; 330/253; 330/257; 330/260; 330/288; 330/294; 330/311
[58] Field of Search ............................ 330/253, 257, 330/288, 310, 311, 293, 294, 306, 260; 323/315

[56] References Cited

U.S. PATENT DOCUMENTS

| | | | |
|---|---|---|---|
| 4,135,162 | 1/1979 | Takahashi | 330/257 X |
| 4,952,867 | 8/1990 | Anderson et al. | 323/315 X |
| 5,182,526 | 1/1993 | Nelson | 330/257 |
| 5,212,455 | 5/1993 | Pernici et al. | 330/253 |
| 5,285,172 | 2/1994 | Okanobu et al. | 330/288 |
| 5,434,538 | 7/1995 | Lee et al. | 330/84 |
| 5,451,902 | 9/1995 | Huang et al. | 330/253 |

OTHER PUBLICATIONS

Data Sheet entitled, "Complete 12–Bit 1.25 MSPS Monolithic A/D Converter", AD1671, pp. 1–16, Oct., 1993.

Data Sheet entitled, "Complete 12–Bit 10 MSPS Monolithic A/D Converter", AD872A, pp. 1–20, Feb., 1995.

Primary Examiner—James B. Mullins
Attorney, Agent, or Firm—Wolf, Greenfield & Sacks, P.C.

[57] ABSTRACT

A reference buffer suitable for driving switched-capacitor or resistive load circuits provides a very low output impedance. The reference buffer utilizes an amplifier with a very large and controlled transconductance configured in feedback and compensated by a load capacitance. Cascaded gain stages are used to provide a large, controlled transconductance. In one embodiment, a reference buffer amplifier includes a plurality of voltage gain amplifiers connected in cascade and at least one transconductance amplifier connected to a last-connected of the plurality of voltage gain amplifiers. The amplifier may further include at least one current mirror amplifier connected to the at least one transconductance amplifier. In another embodiment, the reference buffer amplifier includes at least one transconductance amplifier and at least one current mirror amplifier cascade-connected to the at least one transconductance amplifier. The amplifiers can be differential or single-ended.

15 Claims, 12 Drawing Sheets

FIG. 16

REFERENCE BUFFER WITH MULTIPLE GAIN STAGES FOR LARGE, CONTROLLED EFFECTIVE TRANSCONDUCTANCE

FIELD OF THE INVENTION

The present invention generally relates to a voltage reference buffer and, more particularly, to a voltage reference buffer having a multi-stage amplifier architecture that provides a relatively large and controlled transconductance.

BACKGROUND OF THE INVENTION

Buffer amplifiers commonly provide reference voltages required by switched-capacitor or continuous-time resistive circuits. These circuits typically use the reference voltage in conjunction with one or more separate input signals to perform an analog signal processing function. To avoid distortion in such circuits, the reference voltage provided must be made substantially independent of load variations (i.e., independent of input signals to such circuits). A substantially constant, independent reference voltage is, however, very difficult to achieve, especially when the load varies with applied input signals. A further difficulty is encountered when the buffer amplifiers are required to drive a switched-capacitor circuit that causes short-term transients.

Figure 1:
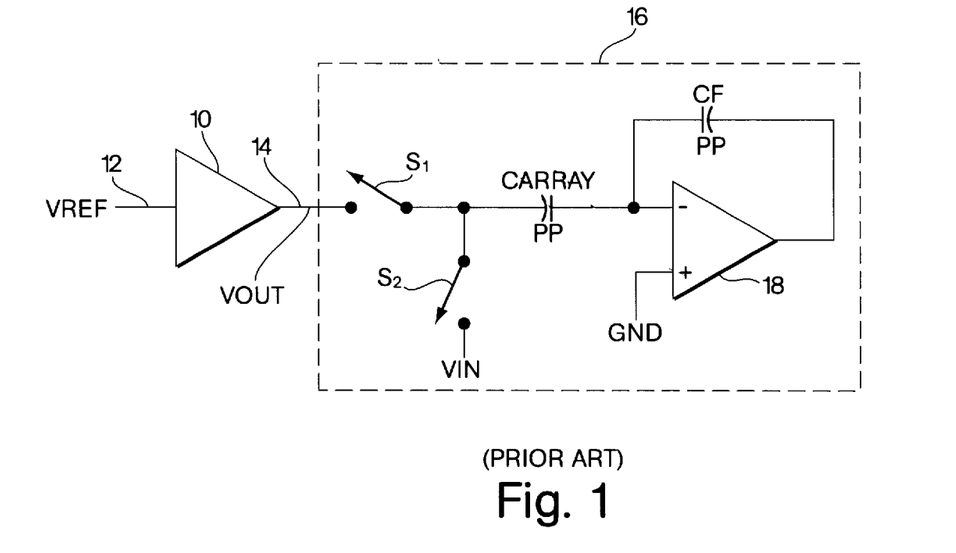
FIG. 1 is a partial schematic, partial block diagram of a prior art reference buffer including a relatively fast internal amplifier.

FIG. 1 is a partial block, partial schematic diagram illustrating a reference buffer amplifier 10 with a load circuit 16. The load circuit 16 is shown, for example, as a switched-capacitor circuit which employs an input capacitor (or capacitor array) $C_{ARRAY}$ and a feedback capacitor $C_F$ connected in a feedback arrangement across amplifier 18. A first switch S1 connects capacitor $C_{ARRAY}$ to the reference voltage provided by the reference buffer amplifier 10, and a second switch S2 connects capacitor $C_{ARRAY}$ to an input voltage $V_{IN}$. The reference buffer amplifier 10 receives a reference voltage $V_{REF}$ on line 12 and provides an output reference voltage $V_{OU}T$ on line 14.

One approach to providing an acceptable reference voltage to a switched-capacitor circuit is to use a sufficiently fast buffer amplifier. The settling time of the reference buffer amplifier 10 could affect the settling time of the overall circuit. Moreover, if the buffer amplifier does not settle with sufficient accuracy within a clock period, then the reference voltage sampled by the load circuit 16 will include a component that is related to the input VIN, thus introducing distortion. Therefore, the settling time of the reference buffer amplifier 10 must be made sufficiently fast to suit the particular application. A drawback to the circuit shown in FIG. 1 is that the reference buffer amplifier 10 consumes a great deal of power in order to maximize speed.

Figure 2:
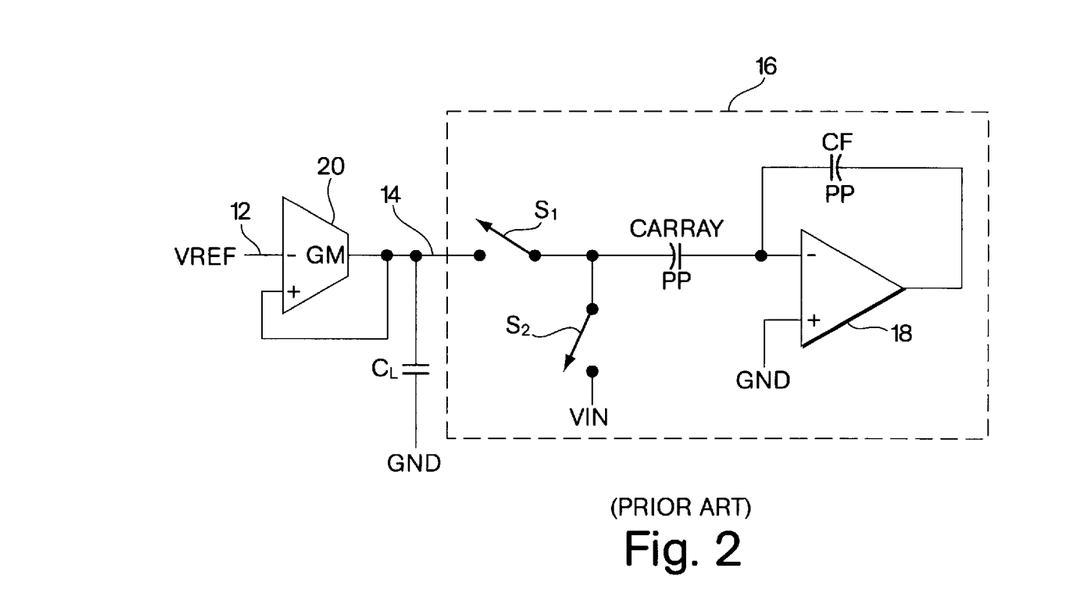
FIG. 2 is a partial schematic, partial block diagram of a prior art reference buffer including an internal amplifier having a large transconductance.

A second approach to providing a reference voltage that is substantially independent of load circuit variations includes reducing the output impedance of the buffer amplifier. Shown in FIG. 2 is such a circuit. The same reference characters are used to denote similar elements in FIG. 2 and throughout the figures. Load circuit 16 is shown, for example, as a switched-capacitor circuit as in FIG. 1.

The reference buffer includes a transconductance amplifier 20 that has a relatively large transconductance (gm) connected in feedback to reduce the output impedance of the buffer amplifier. The transconductance of amplifier 20 dominates the output impedance of the reference buffer at low frequencies. At dc, the output impedance of this buffer is the inverse of gm. However, it is desirable to achieve a low reference buffer output impedance over the entire frequency band of operation of the circuit. Therefore, a load capacitor $C_L$ is connected between the output line 14 and a ground reference to ensure circuit stability. The impedance of the load capacitor $C_L$ decreases with increasing frequency and dominates the output impedance of the buffer at higher frequencies. The approach of FIG. 2 consumes less power than that of FIG. 1. An advantage of this approach is that most of the high frequency energy, such as that contained in the switched-capacitor transient, is filtered by a passive component (capacitor CL), thus eliminating the need for a high-speed active circuit.

Figure 3:
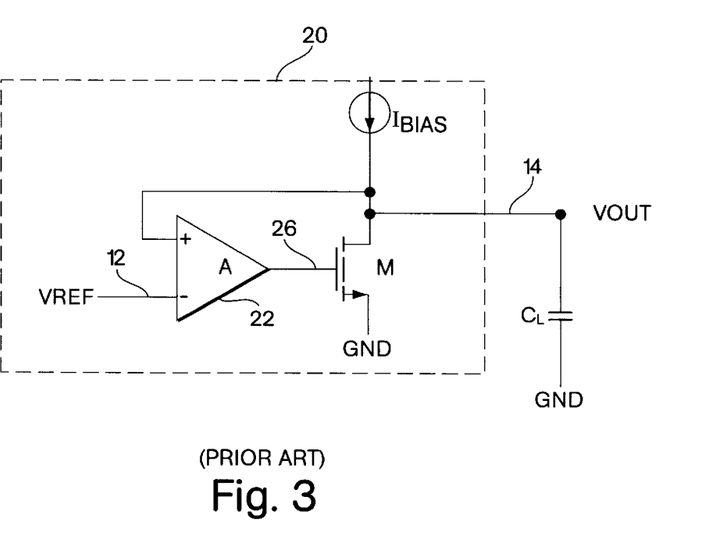
FIG. 3 is a schematic diagram of the prior art transconductance amplifier of FIG. 2.

Shown in FIG. 3 is an exemplary schematic circuit diagram of the reference buffer amplifier of FIG. 2. As shown, the transconductance amplifier 20 includes an internal amplifier 22 having a voltage gain A. Amplifier 22 receives a reference voltage $V_{REF}$ on line 12 at its inverting input. The output 26 of amplifier 22 is connected to the gate terminal of a transistor M. The source terminal of transistor M is connected to ground. The drain terminal of transistor M is connected to output line 14 which provides the reference voltage $V_{OUT}$. The drain terminal of transistor M also is connected to the non-inverting input terminal of amplifier 22. A current source 24, that provides a bias current $I_{BIAS}$, also is connected to the drain terminal of transistor M.

Amplifier 22 is employed to boost the overall transconductance of the transconductance amplifier 20. The overall transconductance of transconductance amplifier 20 is equal to the transconductance (gm) of the transistor M multiplied by the gain A of the amplifier 22: $gm_{overall} = gm_{internal} * A$. Thus, at lower frequencies, the output impedance is related to the inverse of the overall transconductance of the transconductance amplifier 20, multiplied by the attenuation of the feedback path of the reference buffer. At higher frequencies, the output impedance of the reference buffer drops and is dominated by the load capacitor $C_L$. The bandwidth of the reference buffer circuit of FIG. 3 is equal to the overall transconductance of transconductance amplifier 20 multiplied by the attenuation of the feedback path of the reference buffer divided by the load capacitance $C_L$.

Two drawbacks exist with the prior art circuit of FIG. 3. One drawback is that the gain A of amplifier 22 varies significantly both with processing and temperature. These variations cause circuit bandwidth variations. Additionally, while ideally it is desirable to have the gain A of the amplifier be as large as possible to increase the bandwidth of the circuit and reduce the output impedance of the reference buffer, a large gain A may cause the circuit to become unstable due to parasitic poles associated with amplifier 22. Thus, with a large gain A of the amplifier, the load capacitance $C_L$ must be made very large to ensure circuit stability. Generally, the gain A of the amplifier is uncontrolled (due to the above-noted processing and other variations) and the location of the parasitic poles of the amplifier also is substantially unknown and uncontrolled. Therefore, a need exists, due to the unknowns, to make the value of the load capacitance $C_L$ as large as possible. Very large capacitors, however, are expensive and consume a great deal of circuit real estate.

Accordingly, a general object of the present invention is to provide a low-power reference voltage buffer amplifier having a relatively large and controlled transconductance. A further object of this invention is to provide a reference buffer that provides a low output impedance while requiring a small load capacitor $C_L$.

SUMMARY OF THE INVENTION

One embodiment of the present invention, aimed at overcoming the drawbacks associated with prior art reference buffer amplifiers, is directed to a reference buffer amplifier that includes a plurality of voltage gain amplifiers connected in cascade and at least one transconductance amplifier connected to a last-connected of the plurality of voltage gain amplifiers.

In one embodiment of the invention, the reference buffer amplifier further includes at least one current mirror amplifier connected to the at least one transconductance amplifier.

In an embodiment of the invention, each of the internal amplifiers comprising the reference buffer amplifier is a differential amplifier. In another embodiment of the invention, each of the internal amplifiers comprising the reference buffer amplifier is a single-ended amplifier.

In an alternate embodiment of the present invention, a reference buffer amplifier includes at least one transconductance amplifier and at least one current mirror amplifier cascade-connected with the at least one transconductance amplifier.

The features and advantages of the present invention will be more readily understood and apparent from the following detailed description of the invention, which should be read in conjunction with the accompanying drawings and from the claims which are appended to the end of the detailed description.

BRIEF DESCRIPTION OF THE DRAWING

For a better understanding of the present invention, reference is made to the accompanying drawings, which are incorporated herein by reference and in which.

DETAILED DESCRIPTION

Figure 4:
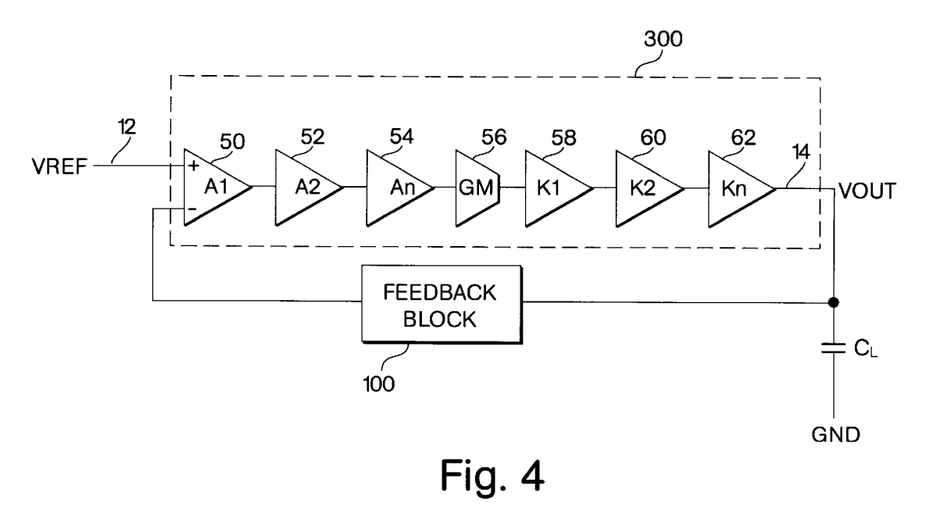
FIG. 4 is a block diagram of a reference buffer according to one embodiment of the present invention.

FIG. 4 is a block diagram showing a reference buffer according to an exemplary embodiment of the present invention. A reference voltage input, VREF, is provided at line 12, and the buffered output voltage, VOUT, is provided on line 14. As shown, the reference buffer amplifier includes a plurality of internal voltage gain amplifiers 50, 52, and 54, a transconductance amplifier 56, and a plurality of current gain amplifiers 58, 60 and 62 connected in cascade. A feedback network 100 provides negative feedback from the output to the input of the reference buffer amplifier. A large capacitor, $C_L$, is connected between the output line 14 and GND. This $C_L$ both compensates the reference buffer amplifier and provides a low impedance at high frequencies.

Each of the internal voltage gain and current gain amplifiers provides a relatively small and controlled gain which, in conjunction with transconductance amplifier 56, yields a large, controlled transconductance of the overall reference buffer amplifier. This large transconductance results in a low reference buffer output impedance. It is desirable to have a controlled overall transconductance that is large enough to provide a reference buffer output impedance which is small enough to suit a particular application. It is also desirable to have a limited overall transconductance to ensure that the reference buffer bandwidth is limited below the point where the circuit becomes unstable.

Each of amplifiers 50, 52 and 54 is a voltage gain amplifier having a respective gain A1, A2 or An. Each voltage gain amplifier 50, 52 or 54 boosts the overall transconductance of the reference buffer amplifier by its gain An. As many or as few voltage gain amplifiers can be cascade-connected. A transconductance amplifier 56 provides its transconductance GM to the overall transconductance of the reference buffer. Multiple current gain amplifiers 58, 60 and 62, having respective mirror gains of K1, K2 and Kn also are cascade-connected. Each current gain amplifier boosts the overall transconductance by its gain Kn. As many or as few current gain amplifiers can be cascade-connected in the reference buffer amplifier. In addition to boosting the overall transconductance of the reference buffer amplifier, each current gain amplifier provides output current gain which aids in driving a load.

The overall transconductance of the reference buffer amplifier 300 is equal to A1*A2* . . . *An*GM*K1*K2* . . . *Kn. Because each of the gains Ai, Ki and GM are relatively small and controlled, the overall transconductance can be made large yet controlled. Thus, by contrast with the prior art, the value of the load capacitor $C_L$ can be made smaller while maintaining stable operation.

Another advantage provided by the scheme of the present invention is that all of the parasitic poles in the reference buffer amplifier can be designed to be at a much higher frequency than those in reference buffer amplifier 20 of the prior art circuit of FIG. 3. This is so because, as one skilled in the art will appreciate, it is much easier to implement a wideband amplification stage if the gain of the stage is low. The resulting increase in parasitic pole frequencies simplifies compensation of the reference buffer amplifier of the present invention.

Figure 15:
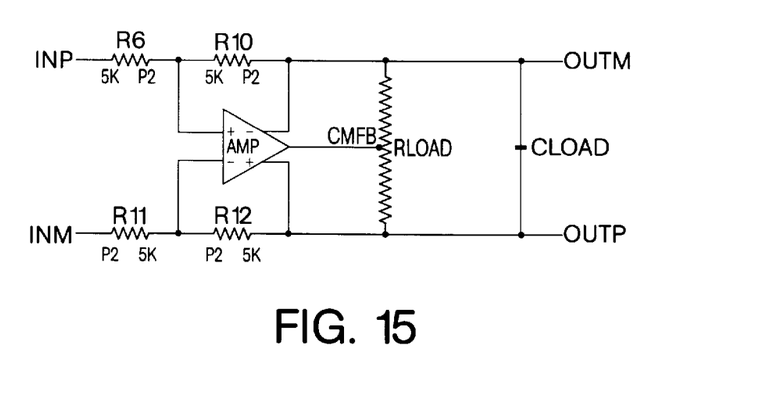
FIG. 15 is a schematic diagram of a differential reference buffer according to the present invention.

It is also possible to employ a differential reference buffer amplifier to provide a differential reference buffer as shown in FIG. 15. The reference buffer is composed of differential reference buffer amplifier, AMP, load capacitor CLOAD, and a feedback network provided by R6, R10, R11 and R12. Differential inputs are provided on lines INP and INM, and differential outputs are provided on lines OUTP and OUTM. Differential reference buffer amplifier AMP is in turn composed of a plurality of cascade-connected voltage gain, current gain, and transconductance amplifiers, as described above. In this example, the common-mode of the output is measured by sensing the midpoint of load resistor RLOAD at line CMFB, and used by circuitry internal to reference buffer amplifier AMP to set the common-mode of the outputs, OUTP and OUTM.

Figure 5:
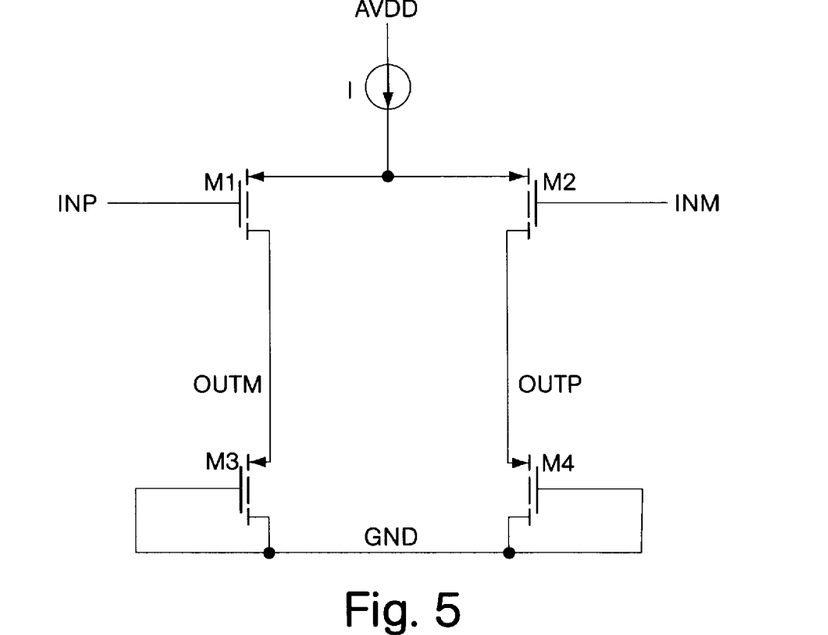
FIG. 5 is a schematic diagram of one embodiment of a gain stage of the reference buffer of the present invention.

FIG. 5 is a schematic diagram of one embodiment of a simple and accurate voltage gain amplifier, usable as one of the voltage gain stages, 50, 52 or 54 of FIG. 4. The voltage gain amplifier consists of an input differential pair, M1 and M2, and a pair of load devices, M3 and M4. The gain of the amplifier is equal to the ratio of transconductances of the input differential pair and load devices. This ratio depends only on the relative values of the transconductances, not on the absolute values of the transconductances. Process and temperature variations will affect the transconductances similarly and therefore will not affect the ratio. It should be appreciated that the values and ratios of values of transistors and other elements listed on the circuit diagrams of FIGS. 5–13 are intended to be exemplary and in no way limit the scope of the invention.

Figure 6:
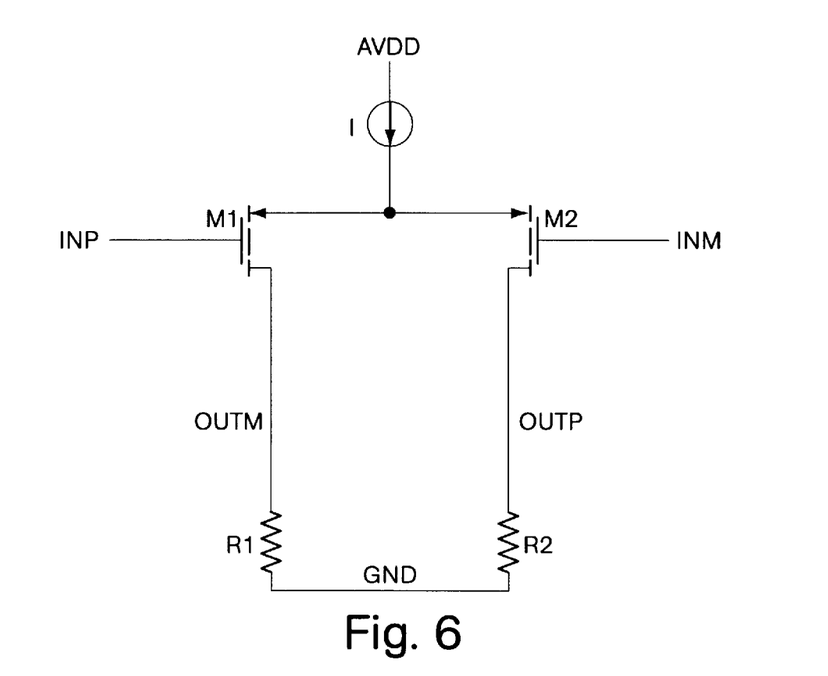
FIG. 6 is a schematic diagram of another embodiment of a gain stage of the reference buffer of the present invention.

FIG. 6 is a schematic diagram of a second embodiment of a simple and accurate voltage gain amplifier, usable as one of the voltage gain stages, 50, 52 or 54 of FIG. 4. The voltage gain amplifier consists of an input differential pair, M1 and M2, and a pair of load resistors R1 and R2. The gain of the amplifier is equal to the transconductance of the input differential pair multiplied by the resistance of R1 and R2. The transconductance of M1 and M2 can be made proportional to the inverse of the resistance of a bias resistor, not shown, using common biasing techniques that adjust the value of bias current I. Therefore, the gain of the amplifier in FIG. 6 depends only on the ratio of the resistance of R1 and R2 to the resistance of the bias resistor, not shown. This ratio depends only on the relative values of the resistances, not on the absolute values of the resistances. Process and temperature variations will affect the resistances similarly and therefore will not affect the ratio.

Figure 7:
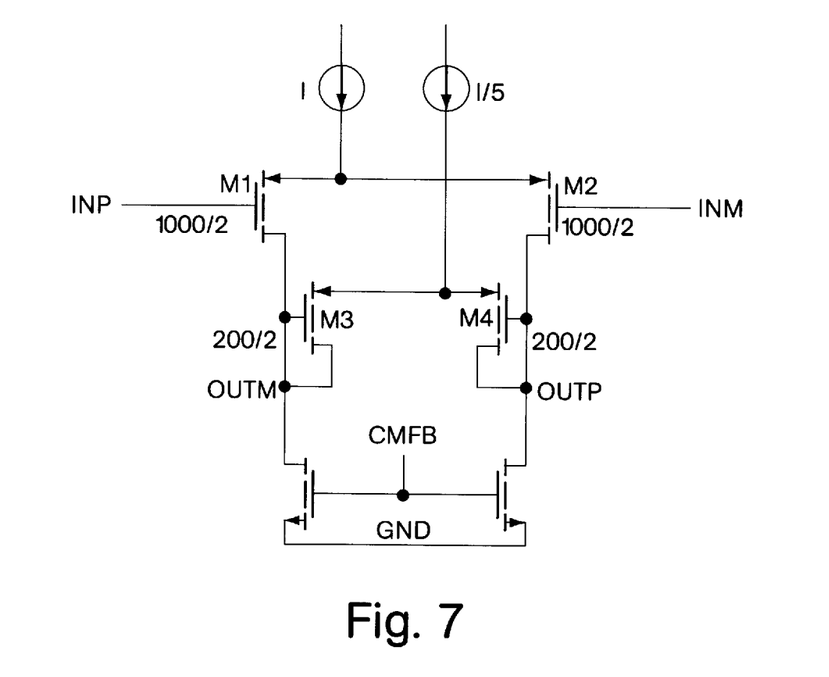
FIG. 7 is a schematic diagram of a single ended embodiment of a transconductance stage of the reference buffer of the present invention.

FIG. 7 is a schematic diagram of a third embodiment of a simple and accurate voltage gain amplifier, usable as one of the voltage gain stages, 50, 52 or 54 of FIG. 4. The voltage gain amplifier consists of an input differential pair, M1 and M2, and load differential pair, M3 and M4. The gain of the amplifier is equal to the ratio of transconductances of the input and load differential pairs. This ratio depends only on the relative values of the transconductances, not on the absolute values of the transconductances. Process and temperature variations will affect the transconductances similarly and therefore will not affect the ratio. By maintaining equal current densities in the two differential pairs, the voltage gain of the amplifier will be determined only by the ratio of device sizes. For example, in the particular circuit shown, the ratio of the input differential pair device sizes to the load differential pair device sizes is equal to 5, and consequently the gain of the circuit is 5.

Figure 8:
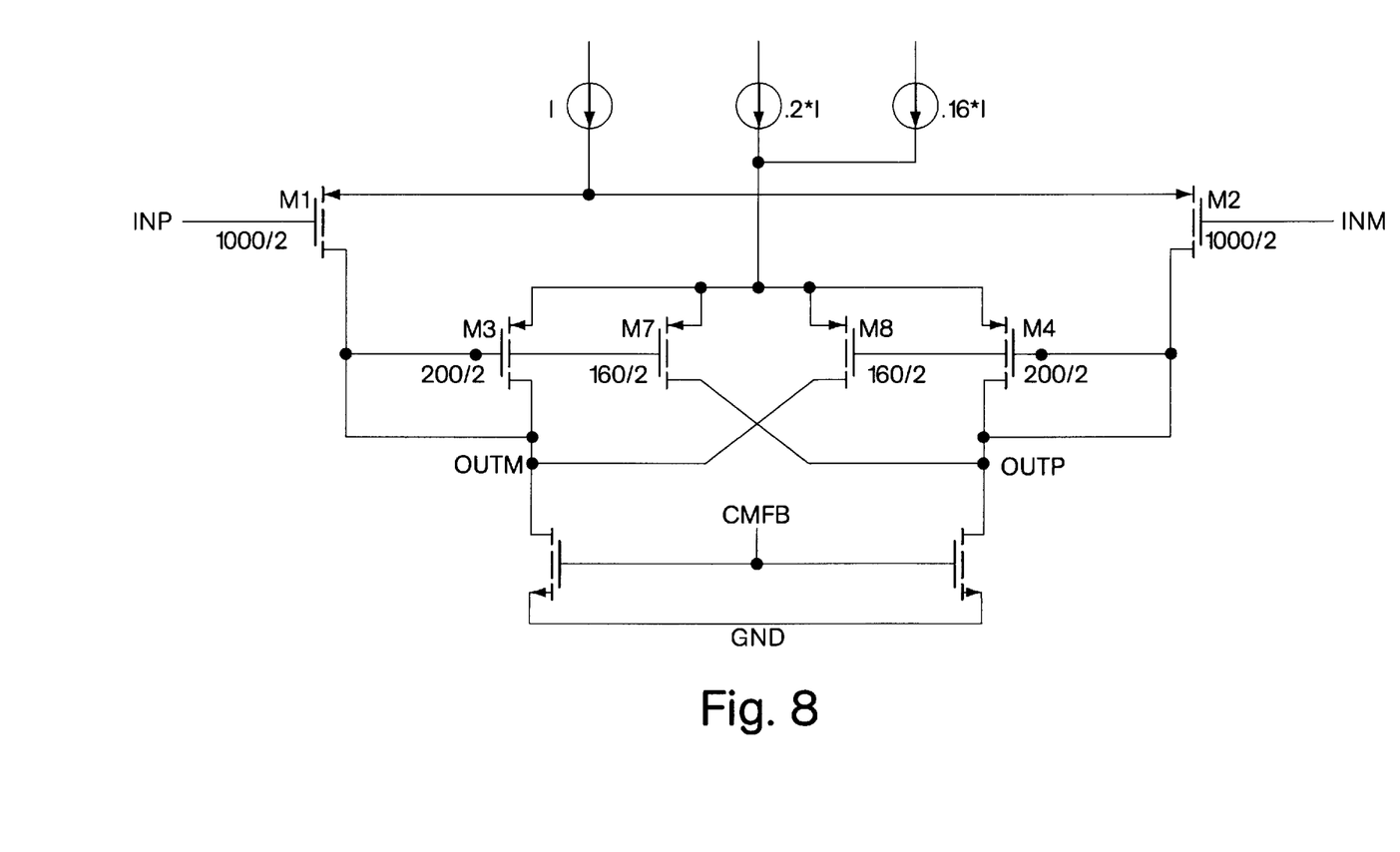
FIG. 8 is a schematic diagram of a differential embodiment of a transconductance stage of the reference buffer of the present invention.

FIG. 8 extends this idea one step further through use of positive feedback. The load differential pair of FIG. 7 is replaced by load circuit M3, M4, M7, and M8 in FIG. 8. This load circuit in FIG. 8 utilizes transistors M7 and M8 to provide positive feedback. This effectively decreases the transconductance of the load circuit and thus increases the voltage gain of the amplifier of FIG. 8. The load circuit transconductance is equal to the transconductance of devices M3 and M4 minus the transconductance of devices M7 and M8. When all transistors are operated at equal current densities, the gain of this voltage gain stage depends only on the ratio of device sizes. For example, because positive feedback transistors M7 and M8 are ⅘ the size of transistors M3 and M4, the effective transconductance of this load circuit is ⅕ the transconductance of transistors M3 and M4. Thus, the overall gain of this stage is 25.

One simple implementation of a current-gain amplifier, suitable for use as one of the current gain amplifiers, 58, 60, or 62 of FIG. 4, is a current mirror. Current gain is achieved by ratioing the sizes of the input and output devices of the current mirror. The current gain is proportional to the ratio of device sizes and therefore is independent of process and temperature variations. One disadvantage of this simple technique is that the current scales with increasing current gain, resulting in an increase in quiescent current and power dissipation. When more than one current gain amplifier is cascaded as illustrated in FIG. 4, the quiescent current increases as the current is amplified from one stage to the next. This increasing quiescent current may be mitigated by using any number of circuits techniques that will be apparent to one skilled in the art. For example, one way to reduce the quiescent current flowing from the output of one current gain amplifier into a succeeding current gain amplifier is to use a current source connected to the junction of the two amplifiers.

Figure 16:
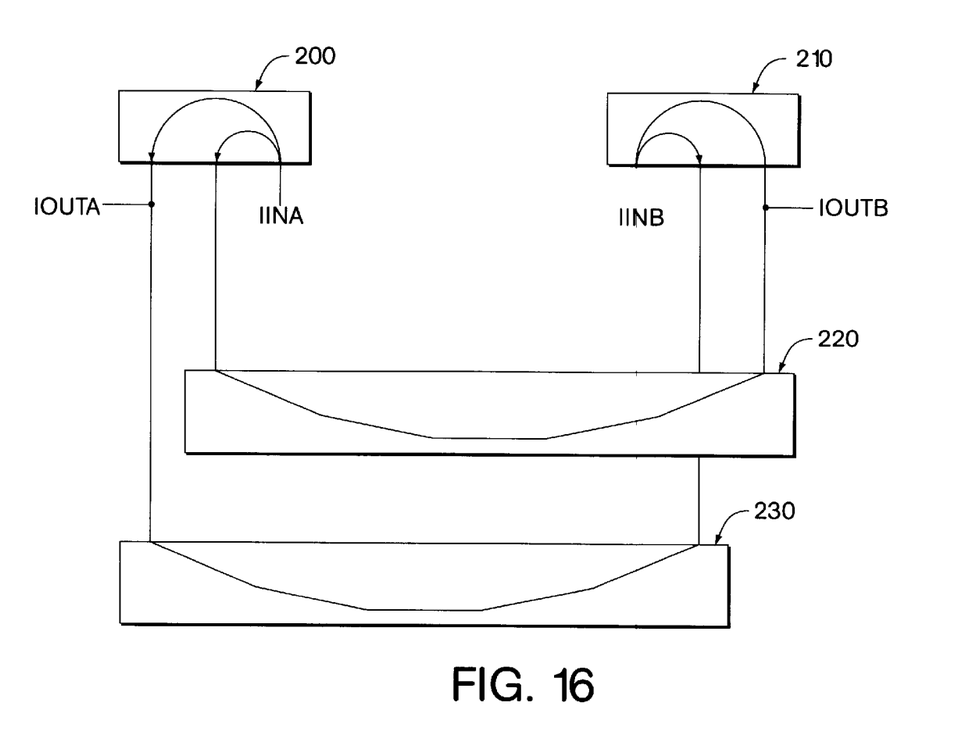
FIG. 16 is a differential current gain amplifier according to the present invention.

FIG. 16 illustrates a differential current gain amplifier that greatly reduces the quiescent current flowing from its outputs. In FIG. 16, a differential input current is applied to input lines IFNA and IINB. The current in line IINA is mirrored (possibly with gain) through current mirror 200, which has two outputs. Similarly, IINB is mirrored (possibly with gain) through current mirror 210, which also has two outputs. One output from current mirror 200 is further mirrored, possibly with gain, through current mirror 220. Similarly, one output from current mirror 210 is further mirrored, possibly with gain, though current mirror 230. The second outputs of current mirrors 200 and 210 are connected to the outputs of current mirror 230 and 220, respectively, at nodes IOUTA and IOUT, respectively. Using appropriate gains throughout the current mirrors, it is possible to achieve current gain from IINA and IINB to IOUTA and IOUTB, without quiescent current flowing into or out of the outputs, IOUTA or IOUTB.

Figure 9:
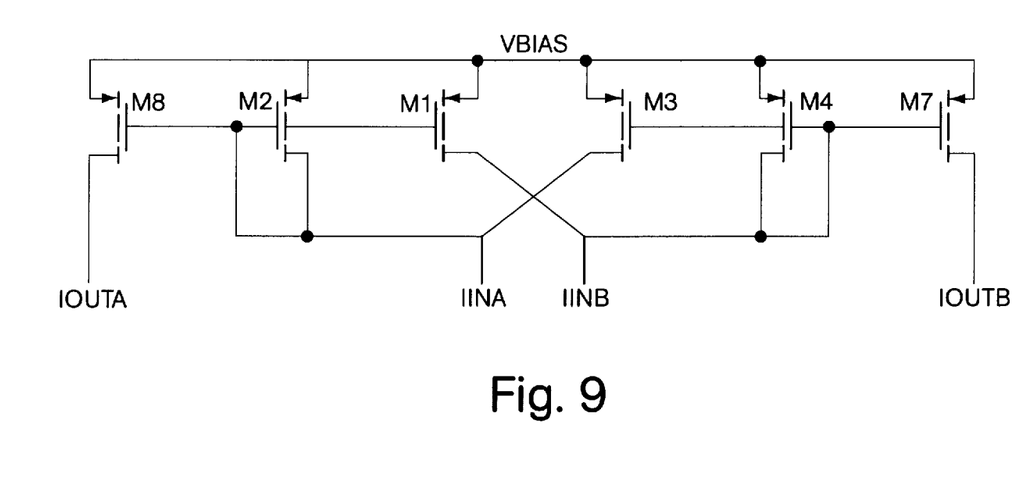
FIG. 9 is a schematic diagram of one embodiment of the reference buffer of the invention.

Alternatively, positive feedback may be used in the current mirror to effectively increase the current gain without increasing quiescent current or power consumption. FIG. 9 is a schematic diagram of an exemplary differential current gain amplifier. The differential current gain amplifier consists of two current mirrors, M4 and M7, and M2 and M8. Differential input current is applied at nodes IINA and IINB, and differential output currents are provided at nodes IOUTA and IOUTB. Positive feedback is used in the current mirrors to effectively increase the small-signal current gain. This positive feedback is provided by cross-coupled devices M1 and M3. As in a current mirror, the current gain depends only on the ratio of device sizes.

Figure 10:
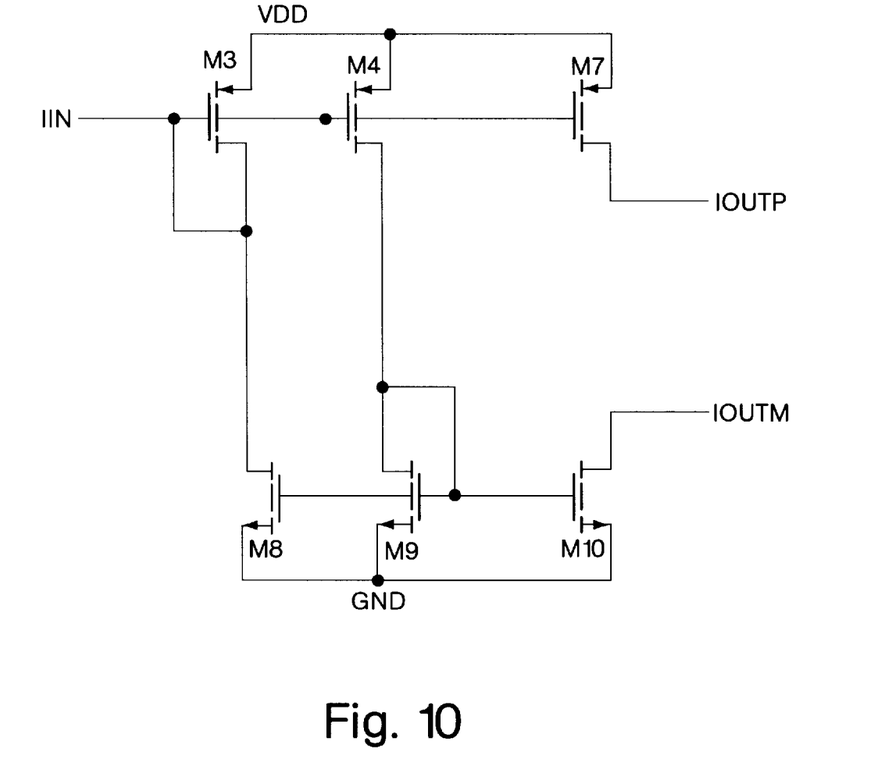
FIG. 10 is a schematic diagram of another embodiment of the reference buffer of the present invention.

Shown in FIG. 10 is a schematic diagram of an alternative exemplary embodiment of a current gain amplifier. The current gain amplifier is formed by two current mirrors. The first current mirror is formed by PMOS transistors M3, M4, and M7. The second current mirror is formed by NMOS transistors M8, M9, and M10. The PMOS current mirror receives an input current at node IIN, and mirrors the current to the NMOS mirror through the drain of M4, and to the positive output (VOUTP) through the drain of M7. The NMOS current mirror receives an input current from the drain of M4 and mirrors the current to the negative output (VOUTM) through the drain of M10. The current is also mirrored through the drain of M8 back to the PMOS mirror in order to provide positive feedback and effectively increase the current gain of the current gain amplifier.

Figure 11:
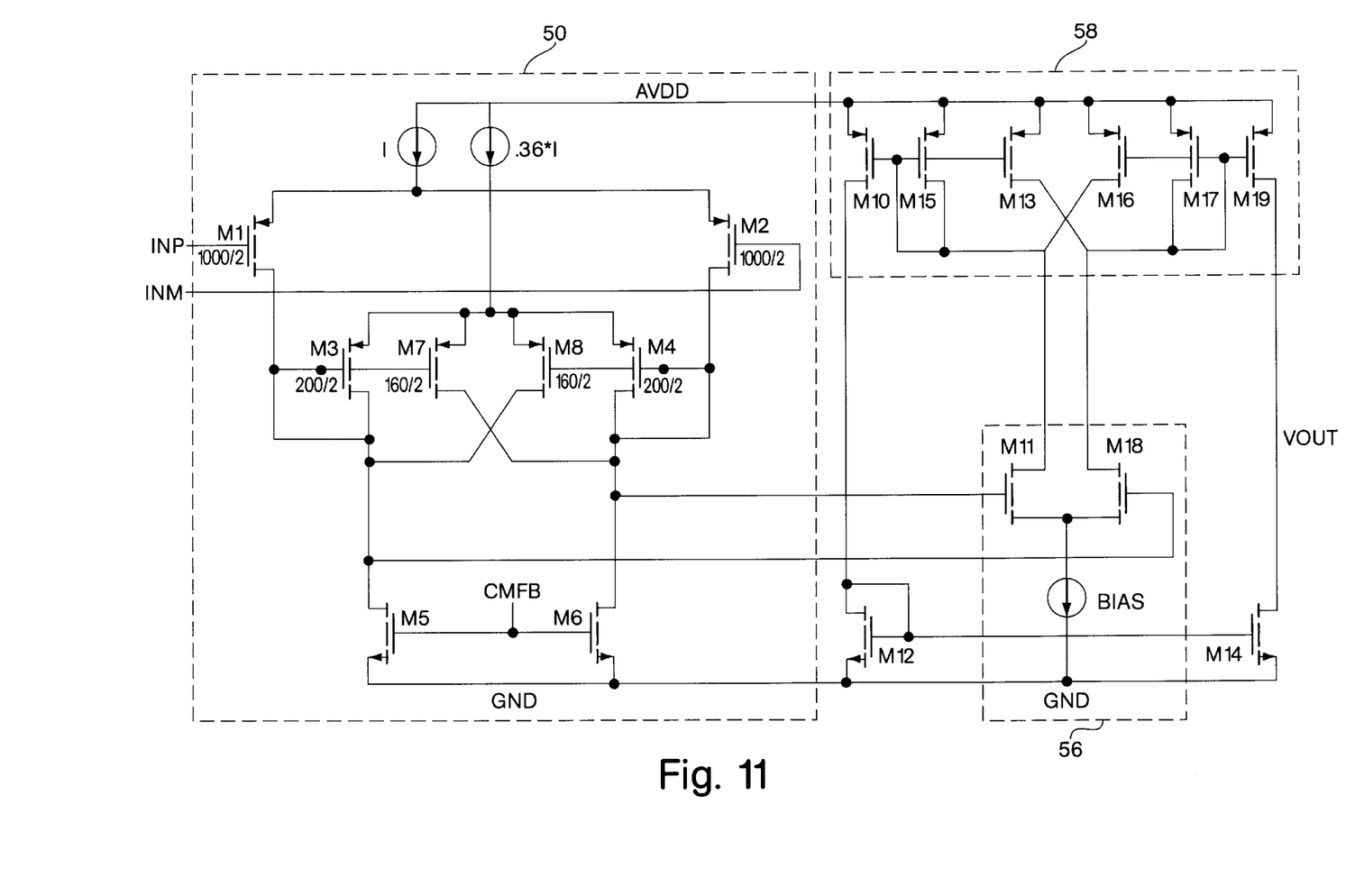
FIG. 11 is a schematic diagram of a single-ended reference buffer amplifier embodiment of the present invention.

FIG. 11 is a schematic diagram of a single-ended reference buffer amplifier of the present invention. As shown, the circuit includes first voltage gain amplifier 50 coupled to transconductance amplifier 56. First voltage gain amplifier 50 receives differential inputs on nodes INP and INM. Transconductance amplifier 56 is coupled to a first differential current gain amplifier 58. Current mirror M12 and M14 is coupled to differential current gain amplifier 58 to provide a differential to single-ended conversion in this single-ended reference buffer circuit. The reference buffer output is provided on node VOUT.

Figure 12:
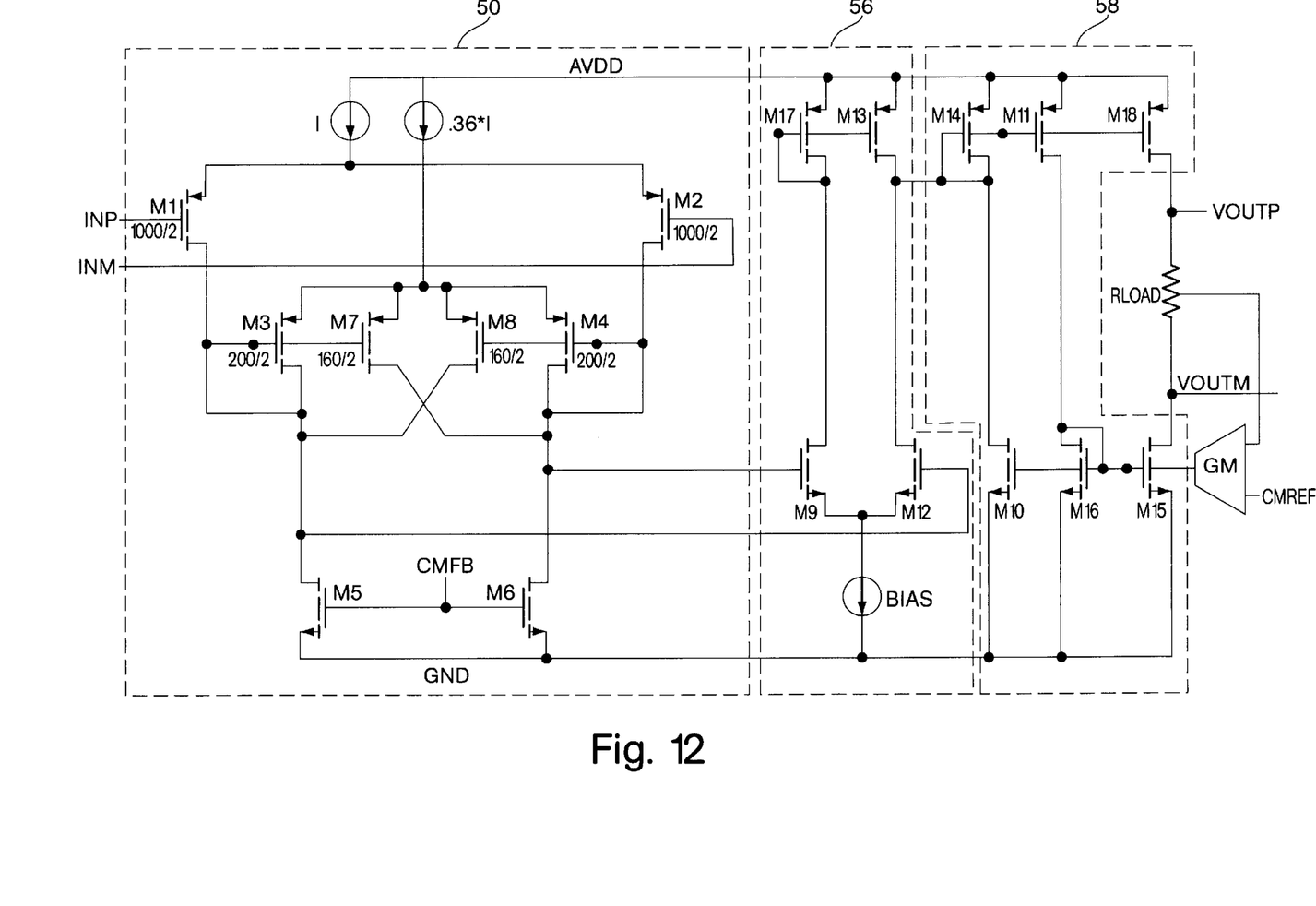
FIG. 12 is a schematic diagram of a differential reference buffer amplifier embodiment of the present invention.

FIG. 12 is a schematic diagram of a differential reference buffer amplifier of the present invention. As shown, the circuit includes first voltage gain amplifier 50 coupled to transconductance amplifier 56. First voltage gain amplifier 50 receives differential inputs on nodes INP and INM. Transconductance amplifier 56 is coupled to a first differential current gain amplifier 58. The differential reference buffer output current flows through load resistor RLOAD, providing a differential output voltage on nodes VOUTP and VOUTM. Common-mode feedback is provided by comparing the midpoint of load resistor RLOAD to the voltage on CMREF and providing a common-mode control current which is fed back into current gain amplifier 58.

Figure 13:
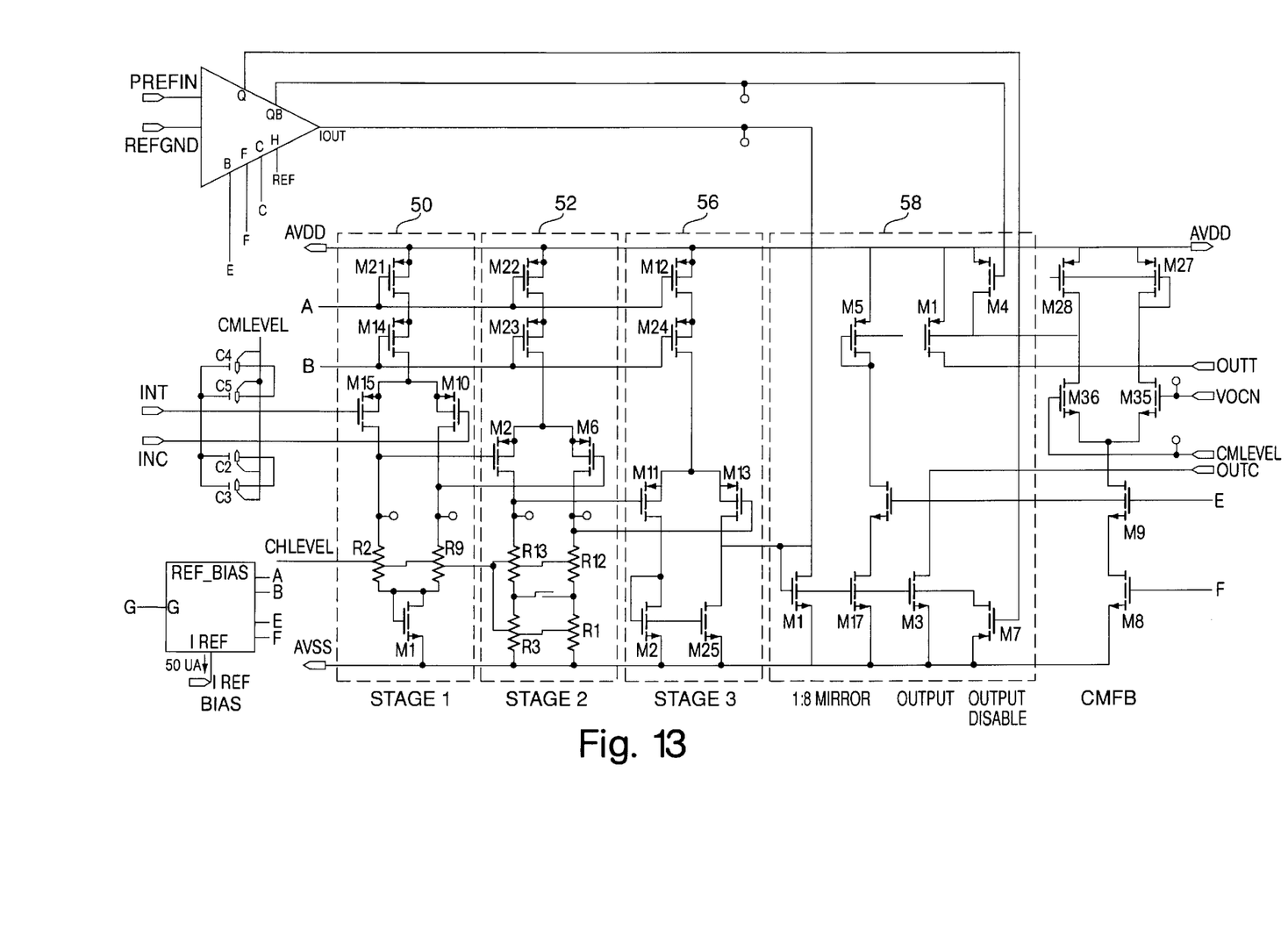
FIG. 13 is a schematic diagram of a differential reference buffer amplifier embodiment of the present invention.

FIG. 13 is a schematic diagram of a differential reference buffer amplifier of the present invention. As shown, the circuit includes first and second voltage gain amplifiers 50 and 52 cascade-connected to one another. Voltage gain amplifier 50 receives differential inputs INT and INC. Cascade-connected to voltage gain amplifier 52 is a differential transconductance amplifier 56. Cascade-connected to differential transconductance amplifier 56 is differential current gain amplifier 58. The output stage provides differential outputs OUTT and OUTC.

Figure 14:
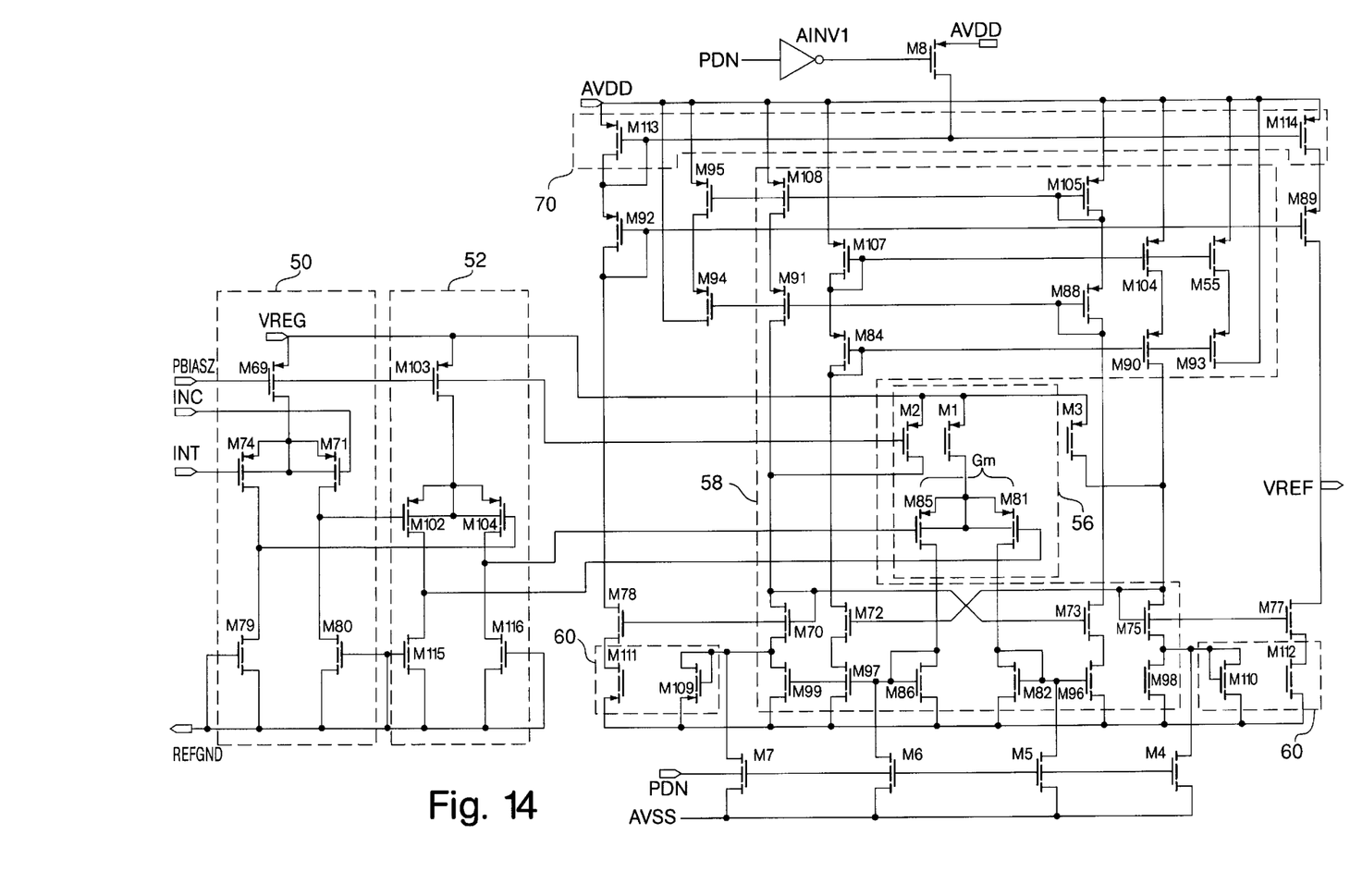
FIG. 14 is a schematic diagram of a single-ended reference buffer amplifier embodiment of the present invention.

FIG. 14 is a schematic diagram of a single-ended reference buffer amplifier of the present invention. As shown, the circuit includes first and second voltage gain amplifiers 50 and 52 cascade-connected to one another. Voltage gain amplifier 50 receives differential inputs INT and INC. Cascade-connected to voltage gain amplifier 52 is a differential transconductance amplifier 56. Cascade-connected to differential transconductance amplifier 56 is differential current gain amplifier 58. Differential current gain amplifier 58 includes a plurality of internal current mirrors to provide a large overall current gain. Cascade-connected to differential current gain amplifier 58 is differential current gain amplifier 60. Current mirror 70 is coupled to differential current gain amplifier 60 to provide a differential to single-ended conversion in this single-ended reference buffer circuit. Current mirror 70 also provides additional current gain. The reference buffer output is provided at node VREF.

It should be appreciated by those skilled in the art, that the ESR (equivalent series resistance) of the load capacitance $C_L$ can cause stability problems in the reference buffer. The ESR of the load capacitance introduces a zero in the transfer function of the reference buffer which occurs at a frequency determined by the inverse of the product of the ESR resistance value and the value of $C_L$ capacitance. This may cause the open-loop gain of the reference buffer amplifier to remain greater than unity out to a frequency as large as the parasitic pole frequencies of the amplifier. This can lead to instability of the circuit, particularly for large values of ESR.

To compensate for the zero introduced by the ESR, a single pole can be added to the reference buffer. The frequency of the single pole is set low enough to cause the unity-gain cross-over of the amplifier to occur at a frequency lower than the parasitic pole frequencies of the amplifier. The frequency of the single pole must also be set high enough so that it does not cause instability when used with a low ESR capacitor. This single pole can be implemented, for example, by adding a capacitance between node INT and node B2 and adding another capacitance between node INC and node A2 of the circuit of FIG. 13. The capacitors work in conjunction with resistive feedback between the output and input of the reference buffer to provide a single pole. This technique for providing a single pole to compensate for the zero introduced by the ESR of the load capacitor CL is exemplary and it should be appreciated that any technique used to introduce this pole is within the spirit of the invention.

It should be appreciated that the reference buffer according to the invention can include one or more voltage gain stages cascade-connected to a transconductance stage or, alternatively, could include one without any current mirror gain stages or more current mirror gain stages cascade-connected to a transconductance stage without any voltage gain stages.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto

What is claimed is:

1. A reference buffer amplifier comprising:
   a transconductance amplifier including a voltage input, received on an input terminal, and a current output, provided on an output terminal, the output terminal connected in feedback to the input terminal, the transconductance amplifier including:
   a plurality of voltage gain stages connected in cascade;
   at least one transconductance stage connected to a last-connected of the plurality of voltage gain stages; and
   a load capacitor, that controls a bandwidth of the reference buffer, one terminal of which is connected to the output terminal of the transconductance amplifier and another terminal of which is connected a node external to the transconductance amplifier.

2. The reference buffer amplifier as claimed in claim 1 further including at least one current gain stage connected to the at least one transconductance stage.

3. The reference buffer amplifier as claimed in claim 1 wherein at least one voltage gain stage includes input devices and load devices having approximately the same doping.

4. The reference buffer amplifier as claimed in claim 3 wherein an output of the voltage gain stage is taken from source terminals of the load devices.

5. The reference buffer amplifier as claimed in claim 3 wherein an output terminal of the voltage gain stage is taken from a common gate and drain terminal of the load devices.

6. The reference buffer amplifier as claimed in claim 3 wherein a current density of the input devices and a current density of the load devices are approximately equal.

7. The reference buffer amplifier as claimed in claim 3 wherein positive feedback is added to the load devices to increase a voltage gain of the voltage gain stage.

8. The reference buffer amplifier as claimed in claim 1 wherein at least one voltage gain stage includes load resistors, a differential input pair and a bias current, the differential input pair and bias current are set such that a transconductance of the differential input pair is proportional to the load resistors.

9. A reference buffer amplifier comprising:
a transconductance amplifier including a voltage input received on an input terminal and a current output provided on an output terminal, the output terminal connected in feedback to the input terminal, the transconductance amplifier including:
a voltage gain stage coupled to the input;
at least one transconductance stage connected to an output of the voltage gain stage;
a plurality of current gain stages cascade-connected to an output of a last connected of the at least one transconductance stage; and
a load capacitor, that controls a bandwidth of the reference buffer, one terminal of which is connected to the output terminal of the transconductance amplifier and another terminal of which is connected a node external to the transconductance amplifier.

10. The reference buffer amplifier as claimed in claim 9 wherein at least one of the current gain stages includes a current mirror.

11. The reference buffer amplifier as claimed in claim 9 wherein at least one current gain stage includes means for reducing a quiescent current at an output of the current gain stage.

12. The reference buffer amplifier as claimed in claim 9 further including means for providing a single pole having a frequency below that of parasitic poles of the reference buffer for aiding in reference buffer stability.

13. A reference buffer comprising:
at least one transconductance amplifier; and
at least one current gain amplifier cascade-connected to the at least one transconductance amplifier;
wherein the at least one current gain amplifier includes a current mirror having positive feedback to increase a current gain of the current gain amplifier without increasing a quiescent power of the current gain amplifier.

14. A reference buffer amplifier comprising:
a differential transconductance amplifier including a voltage input received on an input terminal and a current output provided on first and second output terminals, at least one of the first and second output terminals connected in feedback to the input terminal, the transconductance amplifier including:
a plurality of voltage gain stages connected in cascade;
at least one transconductance stage connected to a last-connected of the plurality of voltage gain stages; and
a load capacitor, connected between the first and second output terminals of the transconductance amplifier, that controls a bandwidth of the reference buffer.

15. A reference buffer amplifier comprising:
a transconductance amplifier including a voltage input received on an input terminal and a current output provided on first and second output terminals, at least one of the first and second output terminals connected in feedback to the input terminal, the transconductance amplifier including:
a voltage gain stage coupled to the input;
at least one transconductance stage connected to the output of an voltage gain stage;
a plurality of current gain stages cascade-connected to an output of a last connected of the at least one transconductance stage; and
a load capacitor, connected between the first and second output terminals of the transconductance amplifier, that controls a bandwidth of the reference buffer.

* * * * *